United States Statutory Invention Registration [19]

[11] Reg. Number: H948

Aklufi [43] Published: Aug. 6, 1991

[54] SEMICONDUCTOR-SEMICONDUCTOR COMPOUND INSULATOR-INSULATOR STRUCTURES

[75] Inventor: Monti E. Aklufi, San Diego, Calif.

[73] Assignee: The United States of America as represented by the Secretary of the Navy, Washington, D.C.

[21] Appl. No.: 574,570

[22] Filed: Aug. 17, 1990

Related U.S. Application Data

[63] Continuation of Ser. No. 936,682, Dec. 1, 1986, abandoned.

[51] Int. Cl.[5] ..... C30B 29/00; H01L 21/265

[52] U.S. Cl. ..... 156/600; 156/603; 156/610; 437/21; 148/DIG. 77; 148/DIG. 83; 148/DIG. 150

[58] Field of Search ..... 156/603, 610, DIG. 64; 437/21, DIG. 150; 148/DIG. 77, DIG. 83, DIG. 150

[56] References Cited

U.S. PATENT DOCUMENTS

| | | | |
|---|---|---|---|
| 3,245,895 | 4/1966 | Baker et al. | 204/164 |
| 3,816,906 | 6/1974 | Falckenberg | 148/DIG. 150 |
| 4,084,986 | 4/1978 | Aoki et al. | 427/93 |
| 4,147,584 | 4/1979 | Garrison et al. | 156/DIG. 64 |
| 4,275,093 | 6/1981 | Sasaki et al. | 156/DIG. 64 |
| 4,279,688 | 7/1981 | Abrahams et al. | 156/613 |
| 4,333,808 | 6/1982 | Bhattacharyya | 204/192 |
| 4,540,452 | 9/1985 | Croset et al. | 156/DIG. 64 |
| 4,584,205 | 4/1986 | Chen et al. | 427/93 |

OTHER PUBLICATIONS

Ajmera et al., "Effects of Hydrogen Annealing on High Power RF Sputtered $Al_2O_3$ Films on Silicon", J. Electrochem. Soc., Oct. 1972, pp. 1421–1424.

Lam, "Silicon on Insulating Substrates—Recent Advances", IEDM, 83, IEEE, 14.1, pp. 348–351.

*Primary Examiner*—Robert L. Stoll
*Assistant Examiner*—Cynthia Harris
*Attorney, Agent, or Firm*—Harvey Fendelman; Thomas Glenn Keough

[57] ABSTRACT

A process for the interdisposition of a semiconductor compound by high dose oxygen ion implantation after a high quality single crystal semiconductor film has been formed on an insulator substrate. Specifically, in one embodiment, after the formation of a single crystal silicon semiconductor film on an insulator substrate of either sapphire or spinel, oxygen ion implantation is formed to create a silicon dioxide layer at the interface between the silicon semiconductor film and the insulator substrate in order to reduce the interface states and form a diffusion barrier between the semiconductor material and the electrical insulator substrate.

13 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

SEMICONDUCTOR-SEMICONDUCTOR COMPOUND INSULATOR-INSULATOR STRUCTURES

STATEMENT OF GOVERNMENT INTEREST

The invention described herein may be manufactured and used by or for the Government of the United States of America for governmental purposes without the payment of any royalties thereon or therefor.

This is a continuation of application Ser. No. 07/936,682, filed Dec. 1, 1986, now abandoned.

BACKGROUND OF THE INVENTION

The present invention relates generally to the field of semiconductor materials and, more particularly, to processes of forming semiconductor films on insulating substrates. Still more particularly, the present invention relates to silicon-on-insulator (SOI) processes and devices and, in its most limited embodiment, the present invention relates to silicon-on-sapphire (SOS) devices and processes.

The usefulness of thin, single crystal silicon films on electrically insulating substrates for electronic devices such as integrated circuits becomes apparent, when on considers that these circuits are contained within the top micrometer of the silicon material. In addition to utilizing the material more effectively, such devices cost less to manufacture. From the device standpoint higher circuit densities as well as improved device performance are obtainable in the areas of high speed signal processing, lower power consumption and higher tolerance in radiation environments.

SOI refers to those devices having a silicon thin film supported on an insulating substrate. SOI devices are becoming more important as the CMOS technology becomes the preferred technology for very large scale integrated circuits (VLSIC). Silicon-on sapphire (SOS) has been the most successful method of growing device quality silicon films on electrically insulating substrates. SOS structures consist of silicon films whose thickness can range from 0.1 to 0.5 micrometers on sapphire substrates. Silicon dioxide, as an insulator substrate, is preferable to sapphire. As an oxide of silicon it can be easily formed with the same purity of silicon. Further, it is more compatible physically and electrically with silicon being an oxide compound of silicon than sapphire which is an oxide compound aluminum. Devices with buried oxide insulating structures are made by forming a continuous oxide layer by implanting oxygen into the bulk silicon substrate. In these devices, the purpose of implanting oxygen is to create an insulator layer of silicon dioxide and cause in a thin silicon film to be electrically isolated from the bulk silicon substrate.

Although SOS has been an attractive materials system for use in the fabrication of VLSIC, the high defects structure of the silicon films has been regarded as a limiting factor in exploiting the full potential of SOS, particularly as film thickness is reduced to meet the requirements of advanced VLSIC's. Low channel mobilities, high leakage currents and a high number of interface states between the silicon film and the sapphire substrate are frequently cited problems. A significant reduction in the defect density within the silicon film of the SOS structure has been obtained by solid phase epitaxy and the simultaneous improvement in device performance has been reported. The silicon ion implant conditions preceeding solid phase epitaxy, however, may also damage the sapphire substrates if not properly selected. The presence of chemical, mechanical and structural defects at the semiconductor-sapphire interface has prevented the full exploitation of this technology. It is apparent then, that by improving this interface the performance of devices whose electrical characteristics are influenced by this interface will also improve.

The periodic nature of a single crystal lattice abruptly terminates at its surface. As a result, atoms located at the surface do not have a nearest neighbor at this surface causing their bond structure to be incomplete or dangle when compared to its inner lattice structure. For a single crystal semiconductor, one effect is to cause the introduction of states within the band gap of the semiconductor which are identified as surface or interface states. By chemically combining these surface atoms so as to form a compound the number of dangling bonds are reduced with concomitant reduction in surface states. The importance of silicon as a semiconductor is attributable to its oxide, silicon dioxide. The ability of silicon dioxide to stabilize the silicon surface is well known. It can in part be attested to by the fact that when present, silicon dioxide improves the silicon surface by reducing the silicon surface recombination velocity dramatically by orders of magnitude, down to a value of 1 cm/sec. Further, the silicon-silicon dioxide dioxide interface has a very low density of interface states. To date, no process or device has been disclosed in which an oxide has been implanted for the purpose of controlling interface or surface states or act as a diffusion barrier between the silicon and sapphire in an SOS or similar device.

SUMMARY OF THE INVENTION

Accordingly, the present invention relates to a process and the device created by the process in which there has been an interdisposition of a semiconductor compound insulator layer between the semiconductor film and the insulator substrate, after a high quality semiconductor crystal thin film has been formed. As a primary example, the semiconductor film may be comprised of silicon, the semiconductor compound insulator may be silicon dioxide and the insulator substrate may be sapphire. In accordance with the present invention the true potential of technologies such as SOS can be realized. With the present invention, more effective materials utilization and lower material costs are achievable as compared to bulk semiconductors. Higher circuit densities as well as improved device performances in the areas of high speed signal processing, lower power consumption and higher tolerance in radiation environments are achievable.

In a preferred embodiment, the present invention involves the interdisposition of a semiconductor oxide by oxygen ion implantation after the highest quality single crystal semiconductor film has been formed on the insulator substrate. The present invention provides for an improved semiconductor-insulator interface that has heretofore not been achievable. The semiconductor oxide layer that is interdisposed between the silicon film and the insulator substrate has the effect of reducing the interface or surface states at the silicon interface nearest the insulator substrate. Further it can act to seal the insulator interface thereby preventing the diffusion of unwanted impurities from the insulator substrate.

OBJECTS OF THE INVENTION

Accordingly, it is the primary object of the present invention to disclose a novel process for forming a semiconductor on insulator structure in which the insulator material is dissimilar from semiconductor material.

It is a concomitant object of the present invention to disclose a novel semiconductor on insulator structure in which the semiconductor is a material that is dissimilar from the insulator material.

It is a further object of the present invention to disclose a novel SOS structure in which the surface states at the silicon interface nearest the sapphire substrate are substantially reduced over prior art structures.

It is a further object of the present invention to disclose a novel SOS structure that provides a barrier against diffusion of unwanted impurities from the sapphire substrate.

It is a further object of the present invention to disclose a silicon on sapphire structure that maximizes the potential of the SOS technology.

These and other objects of the invention will become more readily apparent from the ensuring specification when taken with the language of the appended claims in conjunction with the attached drawings.

DESCRIPTION OF THE PREFERRED EMBODIMENT

Figure 1:
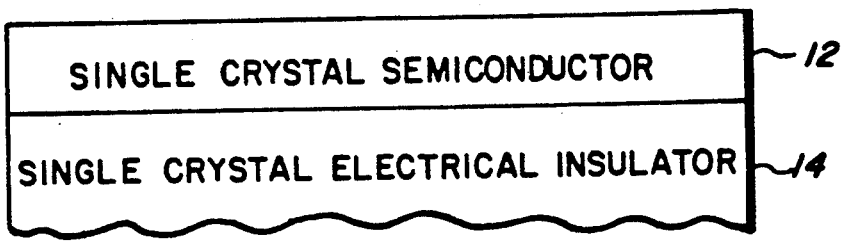
FIG. 1 is a schematic side view of a thin film semiconductor or an electrically insulating substrate.
Figure 2:
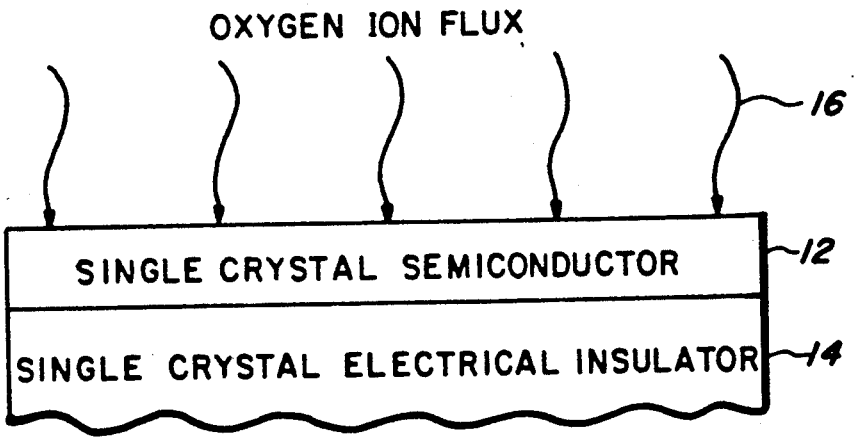
FIG. 2 is a schematic side view illustration of the process of ion implantation into the thin film semiconductor.
Figure 3:
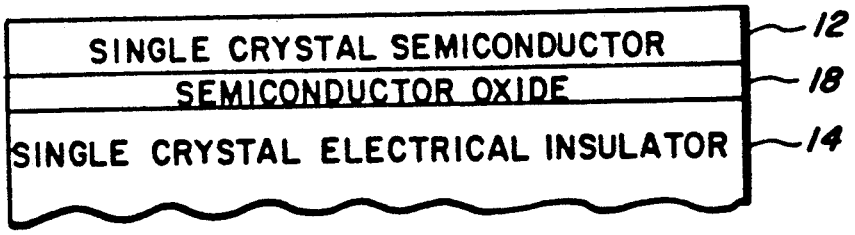
FIG. 3 is a schematic side view of the structure created by the process of FIG. 2.

Referring to FIGS. 1 through 3, the successive steps towards the formation of a semiconductor-semiconductor compound insulator-insulator structure by high dose ion implantation according to the present invention will now be described. In FIG. 1 a semiconductor thin film 12 which is preferably single crystal silicon (Si) is illustrated as having been formed on a semiconductor insulator substrate 14 which is preferably single crystal sapphire ($Al_2O_3$). Alternatively, it is within the scope of the present invention that the electrical insulator substrate may comprise single crystal spinel ($M_gAl_2O_4$) or any other suitable electrical insulator. Similarly, the semiconductor film 12 may comprise semiconductor materials other than silicon, such as, for example, germanium silicon carbide, indium phosphide etc. The techniques for forming silicon on sapphire are well known and are not described herein.

In the past, it has been the practice to create semiconductor devices in the semiconductor film 12 on the insulator substrate 14 within the structure as illustrated in FIG. 1. In accordance with the present invention, however, an oxide layer is interdisposed between the semiconductor 12 and electrical insulator 14 after the highest quality semiconductor film has been formed on the insulator substrate in order to reduce the interface or surface states between the two dissimilar materials, i.e. between the silicon and the sapphire in the particular example described. As is illustrated in FIG. 2, oxygen ions 16 are implanted into the semiconductor film by known oxygen ion implantation techniques. For instance, a high particle energy accelerator can implant the oxygen ions into the semiconductor film 12 at a current on the order of $10^{18}$ atoms/cm and within a temperature controlling environment such that the temperature of the insulator substrate 14 and of the semiconductor film 12 are maintained at a temperature on the order of 500° C. The ion implantation process must of course provide sufficient oxygen at the interface, whereby the semiconductor 12 at the interface with the insulator substrate is transformed to the stochiometric oxide of the semiconductor, silicon dioxide ($SiO_2$) in the present example. The formation of this semiconductor oxide layer 18 between the semiconductor 12-electrical insulator 14 is illustrated in FIG. 3. The choice of implanting energy is dictated by the thickness of the silicon film 12 with thicker films requiring higher energies as would be readily understood by those of ordinary skill in this art.

Following the oxygen implant, a thermal anneal is performed on the structure in an annealing furnace or the like, as would be readily understood to remove any radiation damage and to further improve the crystalline quality of the semiconductor film. This subsequent thermal annealing step allows for the outdiffusion of the interstitial oxygen from the film 12 and also assists in the completion of the formation of the semiconductor oxide molecules in the oxide layer 18 as well as stabilizing the crystallinity of semiconductor layer 12. Typical times and temperatures for this subsequent annealing step would involve annealing the structure illustrated in FIG. 3 at a temperature on the order of 1275° C. for a time on the order of two hours.

It is to be understood that although the present embodiment has been described with respect to an SOS structure, the scope of the present invention is intended to include the interdisposition of a compound which includes but is not limited to the oxide or nitride of any semiconductor or compound semiconductor film on an electrically insulating substrate where the substrate is a material that is dissimilar from the semiconductor film materials. In accordance with the present invention, for instance, nitrogen ions can be implanted at a current of $10^{10}$ atoms/cm into a silicon carbide (SiC) thin film that has been formed on top of a substrate of sapphire to thereby interdispose the semiconductor compound insulator silicon nitride ($Si_3N_4$) at the interface between the silicon carbide and sapphire. Processing and annealing temperatures would be the same as for the SOS example described above.

Obviously, many other modifications and variations of the present invention are possible in the light of the above teachings. It is therefore to be understood that within the scope of the appended claims the invention may be practiced otherwise than as specifically described.

I claim:

1. A method of forming an interface between a semiconductor material and an electrical insulator substrate that is a dissimilar material from said semiconductor material wherein said interface is formed for the purpose of reducing the interface states between said semiconductor material and said electrical insulator, comprising the sequential steps of:

first, providing an electrical insulator;

next, forming a layer of semiconductor material on top of said electrical insulator; and then implanting ions into the region of said semiconductor material that is at the interface between said electrical insulator and said semiconductor material so as to interdispose a semiconductor compound insulator layer between the semiconductor and electrical insulator substrate by converting said region into a compound of said semiconductor material.

2. A method of forming an interface between a semiconductor material and an electrical insulator substrate that is a dissimilar material from said semiconductor material wherein said interface is formed for the purpose of reducing interface states between said semiconductor material and said electrical insulator, comprising the sequential steps of:

first, providing an electrical insulator;

next, forming a layer of semiconductor material on top of said electrical insulator; and then implanting ions into the region of said semiconductor material that is at the interface between said electrical insulator and said semiconductor material so as to interdispose a semiconductor oxide layer between the semiconductor and electrical insulator substrate by converting said region into a compound of said semiconductor material.

3. The method of claim 2 wherein:

said electrical insulator is selected from the group consisting of sapphire and spinel.

4. The method of claim 3 wherein said semiconductor is silicon.

5. The method of claim 2 wherein said semiconductor is silicon.

6. The method of claim 3 further comprising the steps of:

maintaining the temperature of said insulator and semiconductor material on the order of 500° C. during said ion implantation.

7. The method of claim 6 further comprising the step of:

annealing said insulator and semiconductor material following said ion implantation for approximately two hours at a temperature of approximately 1275° C.

8. The method of claim 2 further comprising the step of:

maintaining the temperature of said insulator and semiconductor material on the order of 500° C. during said ion implantation.

9. The method of claim 8 further comprising the step of:

annealing said insulator and semiconductor material following said ion implantation for approximately two hours at a temperature of approximately 1275° C.

10. A semiconductor insulator structure comprising:

a substrate selected from the group comprising sapphire or spinel;

a film of semiconductor material formed over said substrate wherein said semiconductor film is a dissimilar material from said substrate; and an oxide of said semiconductor material interdisposed at the interface between said semiconductor film and said substrate.

11. The structure of claim 10 wherein:

said film is silicon.

12. The structure of claim 11 wherein:

said oxide is silicon dioxide.

13. A method of forming an interface between a semiconductor material and an electrical insulator substrate that is a dissimilar material from said semiconductor material wherein said interface is formed for the purpose of reducing the interface states and forming a diffusion barrier between said semiconductor material and said electrical insulator, comprising the sequential steps of:

first, providing an electrical insulator;

next, forming a layer of semiconductor material on top of said electrical insulator; and then implanting ions into the region of said semiconductor material that is at the interface between said electrical insulator and said semiconductor material so as to interdispose a semiconductor oxide layer between the semiconductor and electrical insulator substrate by converting said region into a compound of said semiconductor material.

* * * * *